United States Patent
Jacoby, Jr. et al.

(10) Patent No.: US 6,310,439 B1
(45) Date of Patent: Oct. 30, 2001

(54) DISTRIBUTED PARALLEL SEMICONDUCTOR DEVICE SPACED FOR IMPROVED THERMAL DISTRIBUTION AND HAVING REDUCED POWER DISSIPATION

(75) Inventors: Elliot G. Jacoby, Jr., Glenside; Russell Weightman, Abington, both of PA (US); Scott A. Billington, Atlanta, GA (US); Joel Spira, Coopersburg, PA (US)

(73) Assignee: Lutron Electronics Company, Inc., Coopersburg, PA (US)

( * ) Notice: Subject to any disclaimer, the term of this patent is extended or adjusted under 35 U.S.C. 154(b) by 0 days.

(21) Appl. No.: 09/268,209

(22) Filed: Mar. 15, 1999

(51) Int. Cl.[7] .......................................... H01J 7/24
(52) U.S. Cl. ........................ 315/112; 315/118; 315/32; 315/50; 315/363
(58) Field of Search ................ 315/112–119, 209 SC; 361/748, 57; 257/706, 712

(56) References Cited

U.S. PATENT DOCUMENTS

| | | | |
|---|---|---|---|
| 3,746,923 | * 7/1973 | Spira et al. | 315/291 |
| 3,925,633 | * 12/1975 | Partridge | 219/10.49 |
| 4,331,225 | * 5/1982 | Bolger | 191/10 |
| 4,766,481 | * 8/1988 | Gobrecht et al. | 357/80 |
| 4,803,380 | * 2/1989 | Jacoby, Jr. et al. | 307/157 |
| 4,858,054 | * 8/1989 | Franklin | 361/57 |
| 5,327,047 | * 7/1994 | Gershen | 315/194 |
| 5,339,217 | * 8/1994 | Cohen et al. | 361/707 |
| 5,432,303 | * 7/1995 | Turek et al. | 174/259 |
| 5,467,251 | * 11/1995 | Katchmar | 361/719 |
| 5,831,828 | * 11/1998 | Cutting et al. | 361/704 |
| 5,845,275 | * 12/1998 | Le Van Suu | 706/1 |
| 5,892,279 | * 4/1999 | Nguyen | 257/712 |
| 5,904,499 | * 5/1999 | Pace | 438/108 |
| 6,028,355 | * 2/2000 | Gates | 257/706 |
| 6,046,918 | * 4/2000 | Jitaru | 363/93 |

* cited by examiner

*Primary Examiner*—Don Wong
*Assistant Examiner*—Tuyet T. Vo (57) ABSTRACT

A single triac on a heat sink is replaced by a plurality of lower rated current, parallel connected triacs for carrying the same total current as the single triac. The plural devices are spaced apart as far as possible, within the confines of an insulation back cover, to reduce the thermal gradient across the heat sink and to reduce the input thermal power to the heat sink. Thermally conductive compressive sheets thermally couple the flat heat sink to a face plate on the side of the heat sink opposite to the side receiving the triacs.

38 Claims, 11 Drawing Sheets

DISTRIBUTED PARALLEL SEMICONDUCTOR DEVICE SPACED FOR IMPROVED THERMAL DISTRIBUTION AND HAVING REDUCED POWER DISSIPATION

FIELD OF THE INVENTION

This invention relates to electric power controllers and more specifically relates to a novel structure and process for making a wall mounted light dimmer control having a reduced temperature rise.

BACKGROUND OF THE INVENTION

Electric power controls, particularly wall mounted dimmers are well known. U.S. Pat. Nos. 3,746,923 and 4,803,380, the disclosures of which are incorporated herein by reference, show typical light dimmer controls having a manually operable slide control. These devices conventionally have a controllable a-c current control device such as a triac mounted on a metal, typically aluminum, heat sink to dissipate heat generated by the triac during its operation. A control circuit which may be fixed to a suitable printed circuit board and a linearly adjustable potentiometer, which is connected to the slide control, is mounted atop, or adjacent, the triac. A rotary potentiometer may be used in place of the linearly adjustable potentiometer. The triac, potentiometer and control circuit are enclosed by a back cover. The external power conductors, such as insulated wires or stabs, which are connected to the interior triac, extend through the back cover for connecting the lighting load in series with an a-c source.

The control circuit is connected to the triac gate terminal to control the conduction phase of the triac, thus varying the power to the load. An on-off switch may also be provided in series with the triac to effect positive turn-off of power to the load when the slide or other control reaches an end position, or alternatively when a separate switch activator is operated.

The slide control is preferably mounted within an insulation adapter cover plate mounted on the surface of the heat sink plate opposite to the surface receiving the triac. A large number of other control schemes can also be used, including control by a microprocessor or coded radiation from a hand held radiation source.

Underwriters Laboratories, an independent approval agency, requires that the temperature rises measured at several strategic locations on the dimmer not exceed specified maximums. These temperature rises are measured over ambient temperature with the dimmer installed in a wall box in an insulated wall, with the dimmer carrying the maximum rated load. Further these temperature rises are the steady state temperature rise reached after the dimmer has been operating for an extended period of time. One requirement is that the back cover, which encloses all of the dimmer electronics, not exceed a 65° C. temperature rise. This requires the selection of a particular type of triac (or other semiconductor switch) which has a sufficiently low power dissipation at the highest rated load current. Generally, a heat sink with fins and/or channels for flow of air past the heat sink have been needed to sufficiently cool the triac and wall box when load current is increased. Such devices require a large and relatively unsightly "stand-off" of the face plate of the dimmer from a wall. It has not been possible to increase the rating of an otherwise well designed low profile dimmer from 1500 watts to 2000 watts because the back cover temperature rise will exceed 65° C. without a special heat sink. Thus, users of such low profile dimmers have to use plural 600 watt and/or 1500 watt units (without fins) to supply a 2000 watt load.

It would be very desirable to provide a 2000 watt dimmer which does not require exotic cooling techniques to achieve such power control without unduly increasing the temperature rise of the dimmer components such as the back cover and permitting a minimum stand-off of the dimmer face plate from the wall surface to which the dimmer is mounted.

BRIEF SUMMARY OF THE INVENTION

In accordance with the present invention, the heat sink of a dimmer control is better utilized to transfer heat from a semiconductor switching means, to produce a reduced peak temperature rise of the heat sink and back cover by distributing the input heat generated by a triac or other semiconductor switching device over a larger portion of a heat sink of given area. More specifically, the single triac or controllably conductive switching device of the prior art is replaced by a plurality of parallel connected similar switching devices which are relatively widely spaced (within the dimension or "footprint" of the back cover), over the surface of the heat sink. An identical function is carried out by both the single device or the plurality of identical devices. In other words, the plural parallel devices which replace a single device each carry a respective fraction of the total load current with identical instantaneous current magnitudes. That is, each of the parallel devices carry currents of substantially equal instantaneous magnitude as a function of time. Thus, a single triac may be replaced by a plurality of identically functioning triacs. This distinguishes from the prior art class of devices in which plural devices of different functions, for example, spaced unidirectional and back to back connected (antiparallel) devices (SCRs) may be spaced on a common heat sink as in U.S. Pat. No. 5,327,047 to replace a single triac. More specifically, U.S. Pat. No. 5,327,047 shows two discrete SCRs which respectively energize a lamp load during alternate half cycles of the AC voltage. The necessary separate placement of the SCRs produces lower heat sink temperature than a single equivalent triac at the cost of added components and complexity. While the two SCR's of the U.S. Pat. No. 5,327,047 patent may superficially be thought to be in parallel, they are really in an antiparallel arrangement since the two SCRs conduct current in different directions.

In accordance with the invention, a given amount of heat is injected into the heat sink over a much larger area than with a single triac which results in a reduced peak temperature of the heat sink. The spreading out of the heat sources also helps reduce the thermal gradient over the heat sink surface. As a further and unexpected benefit of using two or more parallel connected, but physically and thermally spaced devices of identical function in place of the single device, the actual total power dissipation of the plural devices was also found to be reduced. Thus, the total heat input to the plate was found to be also reduced by practice of the invention.

As a still further advantage of the invention, it has been found that the device with plural parallel triacs is more robust than single unit device, having a much higher fusing current $I^2t$. This provides significant improvement in enabling the dimmer to survive lamp blow out.

Another further and unexpected result of using two or more parallel connected, but physically and thermally spaced devices in place of a single device is that the reliability of the dimmer is not decreased. One of ordinary skill would expect that a dimmer with a plurality of triacs would be less reliable than a dimmer with a single triac because the individual failure rates of the triac would ordinarily be multiplied. Applicants have found the reliability of the dimmer using plural triacs remains approximately the same as that of a dimmer using a single triac due to the significantly lower temperature of each of the plural parallel triacs caused by less heat being generated and by the heat sources being spread out.

Preferably the heat sink in the dimmer of the invention is a flat plate of thin high thermal conductivity material, preferably copper. It has been found that the use of copper in place of the conventional aluminum heat sink enables the parallel operation of the spaced triacs or equivalent devices, such as spaced pairs of simultaneously conducting SCRs; IGBTs; and diodes (and other bipolar devices) without the need for external current balancing circuits. That is, the parallel devices are sufficiently thermally coupled (even though spaced) that automatic current balance occurs.

As a further feature of the invention, the copper or other metal plate is also thermally coupled to the insulation adapter plate which carries the externally operable dimmer control. This insulation plate is, in turn, exposed directly or indirectly to the external ambient and thus further cools the heat sink plate. The coupling medium can be a compressible, thermally conductive fabric which is compressed between the heat sink and insulation plates to carry out this thermal conduction action.

As a further feature of the invention, the prior art control circuit for driving the single triac must now provide firing signals for simultaneously firing each of a plurality of parallel devices which replace the triac. A novel control circuit is provided in which the control circuit connected to each of the parallel connected triacs is arranged to insure substantially equal inductance and resistance in each control circuit. Consequently, a single timing circuit can be used for the plural devices and simultaneous firing or controlled conduction is ensured.

BRIEF DESCRIPTION OF THE DRAWINGS

FIG. 3 schematically, shows the thermal gradient across the heat sink plate of FIGS. 1 and 2a.

DETAILED DESCRIPTION OF THE DRAWINGS

Figure 1:
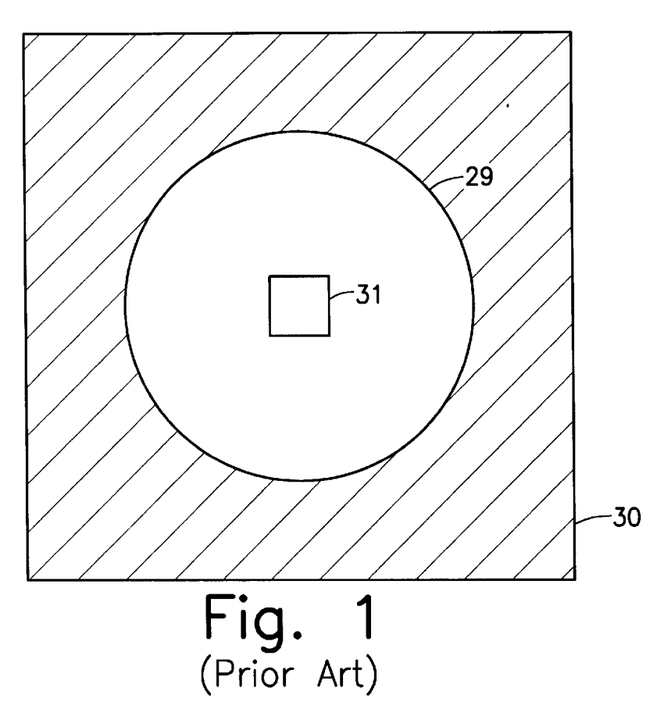
FIG. 1 schematically shows the thermal distribution of a single centrally mounted heat generating semiconductor device on the surface of a heat sink, as in the prior art.

Referring first to FIG. 1, there is shown, in schematic form, a heat sink 30 which may be a flat square plate, which is commonly of aluminum in the prior art, and which has a single semiconductor device 31 thermally mounted thereon in a central location. Heat sink 30 may have parallel flat opposing surfaces or, if desired, one surface of heat sink 30 may be finned. While the invention permits the increase of wattage rating of a wall box dimmer without using a finned heat sink, dimmers having finned heat sinks can also benefit from the present invention. The device 31 may be any type of semiconductor switching device, for example, a triac; one of a pair of back-to-back connected SCRs, GTO devices; or IGBTs to name the most likely. In FIG. 1 plate 30 may be a 0.060" thick 4.5" square copper plate with an arbitrarily chosen 10 Watt load (device 31) centered in the middle.

The single device 31 produces heat during its operation due to forward current flow through its inherent forward voltage drop and due to current flow through its on-resistance, and this heat is conducted into plate 30. However, because of the thermal gradient over the plate 30, the more remote regions of the plate, for example, the shaded area beyond line 29 is relatively ineffective in removing heat from device 31. Line 29 is a temperature gradient which is within 30C of the ambient air. For an arbitrary amount of current the plate 30 has a maximum test point temperature in the center of plate 30 of $T_{PI}$ of 107° C.

Figure 3:
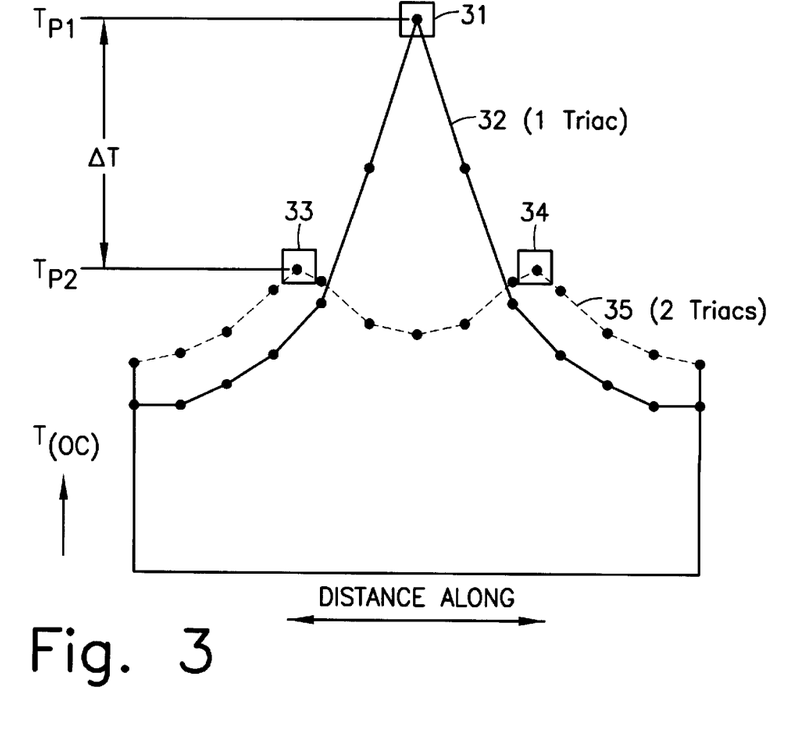

The thermal profile laterally across the plate 30 in FIG. 1 is shown in the solid line 32 in FIG. 3. The peak temperature $T_{p1}$, is measured at the test point in the center of plate 30. This relatively high temperature will cause the temperature of a back cover enclosing device 31 to also rise to its peak value. Clearly, if the wattage of the unit is increased, the power loss of device 31 is increased so that the peak temperature $T_{p1}$ would increase, as would the back cover case temperature.

The effect shown and described in FIG. 1 has made it impossible to increase the rating of a 1500 watt dimmer having a thin heat sink plate 30 to 2000 watts while keeping the back cover temperature rise less than 65° C. (an Underwriter's Laboratory requirement) without resort to a much thicker heat sink or a heat sink with fins and a cooling air flow along the fins. These alternatives, however, make the dimmer face plate stand farther out from the surface of the wall than is desired, as will be later discussed.

In accordance with the invention, the single triac 31 (or equivalent heat source) of FIG. 1 is replaced by two or more parallel triacs or other equivalent semiconductor switching devices, which together carry the same current as the single device, and are spaced apart as far as possible on the heat sink plate (within the inherent limits of the back cover area or footprint and while being sufficiently thermally coupled to insure current balance behavior between the parallel devices) to thereby improve the utilization of the heat sink area or, in other words, to reduce the thermal gradient across the heat sink plate surface. Thus, in FIG. 2a, two triac devices 33 and 34 are spaced apart as far as practicable. This new geometry will be seen to substantially increase the effective and unshaded area of the plate 30 within line 36. Line 36 is another temperature gradient which is within 3° C. of the ambient air. For the same arbitrary total amount of current as in FIG. 1, the plate has a maximum temperature $T_{p1}$ of 83° C. This effect is also shown in dashed line curve 35 in FIG. 3 where it is seen that the peak temperature of plate 30 of FIG. 2a of devices 33 or 34 $T_{p2}$ is less than the peak temperature $T_{p1}$ for single device 31 of FIG. 1 by 24° C.

Figure 2A:
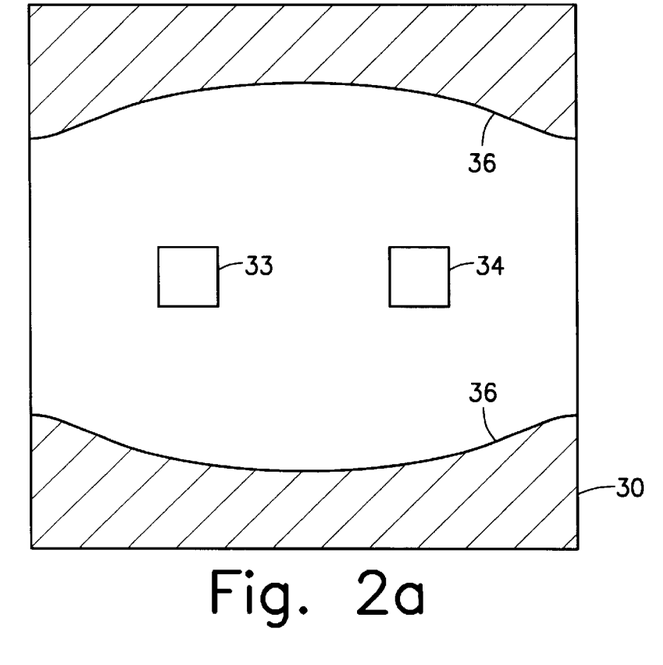
FIGS. 2a and 2b show the disposition of spaced, identical parallel connected semiconductors on the heat sink of FIG. 1 in which the devices carry the same total current as the single device of FIG. 1.
Figure 2B:
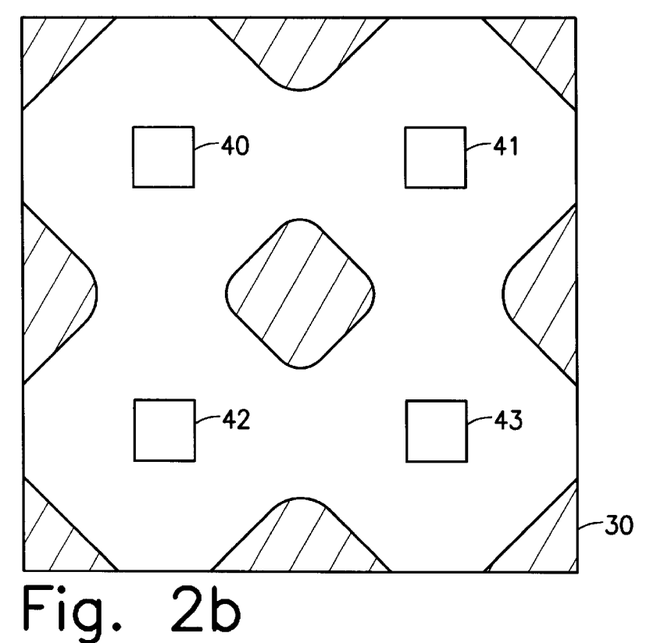

A still further temperature gradient improvement can be had by the use of 4 parallel connected triacs 40, 41, 42 and 43 (which each carry ¼ of the total current of the triac 31 of FIG. 1) as shown in FIG. 2b. More specifically, each of triacs 40 to 43 carry 4.16 amperes at full load current for a total of 16.67 amperes in a 2000 watt dimmer. It will be noted from FIG. 2b that a very large portion of the total area of plate 30 is useful in the heat removal process and will cause a still further reduction in the peak temperature of plate 30, and a consequent reduction in the peak temperature of the back cover (not shown) which encloses the triacs 40 to 43. The plate 30 of FIG. 2b has a maximum temperature of 81° C. for the same amount of current as in FIG. 1.

A still further, and unexpected added benefit over the benefits described above has also been found. Thus, the actual power dissipation of the plural devices has been found to be less than that of the single equivalent device.

This surprising result comes about as follows:

The total power dissipation of a triac is:

$$P_{DIS} = (V_{TO} \times I_{AVE}) + (I^2_{RMS} R_{TO})$$

where $V_{TO}$=forward turn-on voltage drop of the triac (or other bipolar function device);

$I_{AVE}$=average current;

$I_{RMS}$=root mean square current;

$R_{TO}$=triac resistance when turned on.

In a 2000 watt, 120 volt dimmer, $I_{RMS}$ is about 16 amperes and $I_{AVE}$ is about 14.4 amperes. For a single triac, for example, an ST type BTA 41 device (rated at 40 amperes), test data shows $V_{TO}$ is 0.85 volts and $R_{TO}$ is 0.012 ohms. Thus, $P_{Dis}$ for the single triac can be calculated to be 15.3 watts. Similarly, the power dissipation for a 1500 watt, single triac dimmer is calculated to be 11.3 watts.

If, as in FIG. 2a, 4 similar triacs replace the single triac of FIG. 1, these triacs will each have an $I_{RMS}$ of about 4 amperes and $I_{AVE}$ of 3.6 amperes for a 2000 W load. Using the same type device for each of the 4 triacs, $P_{DIS}$ for all 4 devices can be calculated to be only 1300 watts for ST type BTA-41 devices.

Therefore, the use of 4 triacs in place of a single one reduces power dissipation from 15.3 watts to 13.0 watts or almost a 15% decrease in power dissipature. This extraordinary reduction translates into a further reduction in peak temperature rise of from 10° C. to 20° C. at the heat sink. It can be shown that either 2 or 3 parallel devices will also produce a reduced $P_{DIS}$ over that of a single triac.

Applicants have discovered that the benefits obtained by the use of plural identical devices in place of a single device does not create an increased material cost. Thus, since each of a plurality of parallel triacs is carrying less current, a single 40A triac such as an ST type BTA-41 can be replaced by lower current triacs such as a ST type BTA 24 (a 25 amp device having similar characteristics) in accordance with the present invention. The lower current triacs have a lower cost per device. The ST type BTA 41 device has a present cost of about three times the present cost of a ST BTA24. Thus, when two smaller devices are paralleled, the total cost of the smaller parallel devices is less than one large device. As pointed out previously, the reliability of the plural devices is not reduced over that of a single triac because the devices are operated at a lower percentage of their rated current. If four smaller parallel devices are used then they can have a current rating of 16A.

This reduced temperature then makes it possible to increase the rating of a dimmer with a flat heat sink from 1500 to 2000 watts, without increasing the heat sink thickness or using fins on the heat sink for improved cooling.

For the systems of FIGS. 2a and 2b to act as described above, it is necessary to insure a fixed balance of current between the parallel connected devices. It has been found that this balance can be obtained without extensive balancing circuits, by employing a high thermal conductivity material, preferably copper, for the heat sink plate which thermally couples the spaced devices to insure similar die temperatures and a balanced forward voltage drop. A copper plate of a non-critical 0.062 inch thickness has been found to work well for this purpose. Greater thickness are also useful, but require a larger stand-off of the dimmer from the wall surface.

Figure 4:
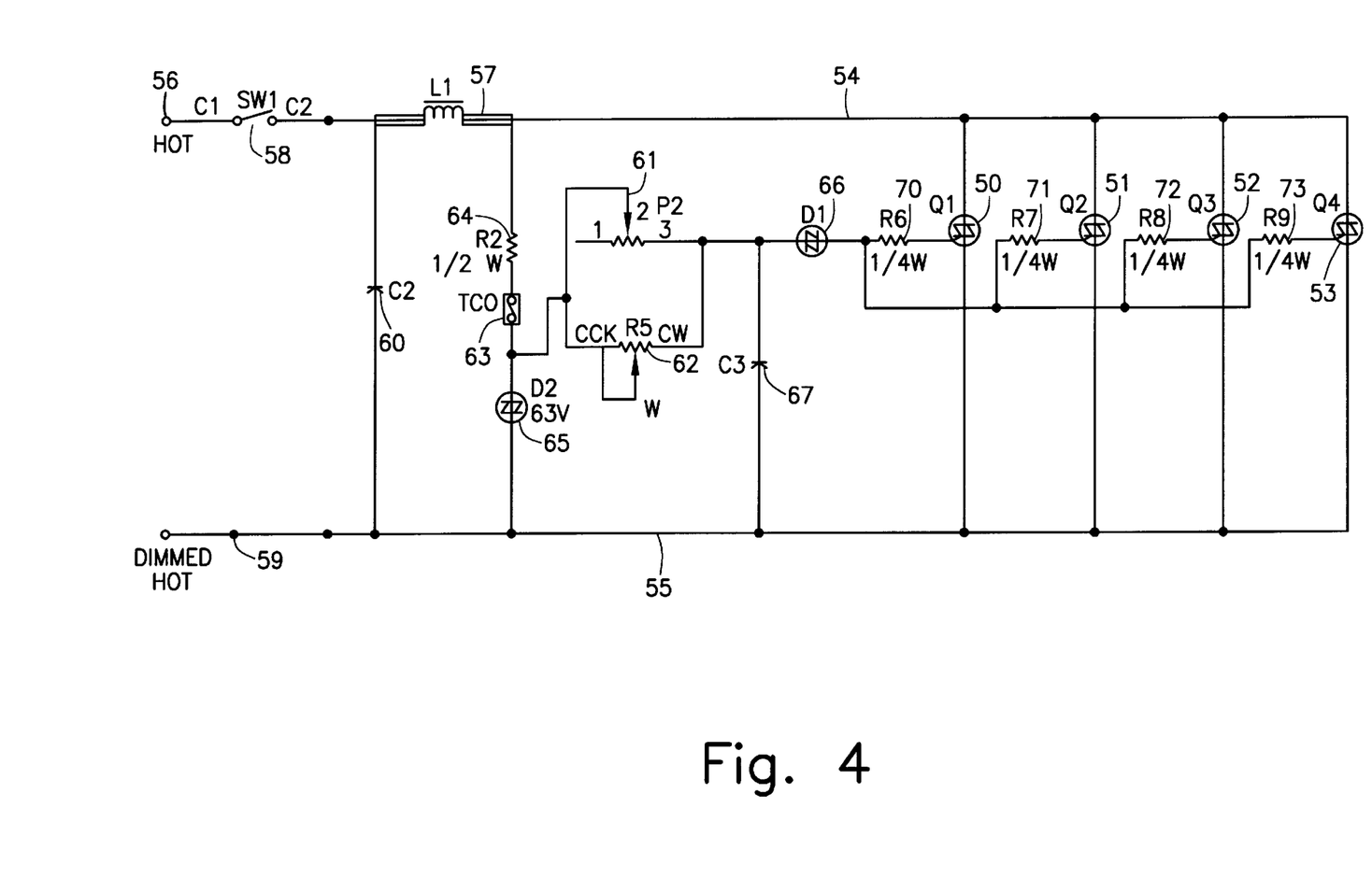
FIG. 4 is a circuit diagram of the novel circuit of the invention, in which 4 identical spaced parallel connected triacs use a novel common control circuit.
Figure 4A:
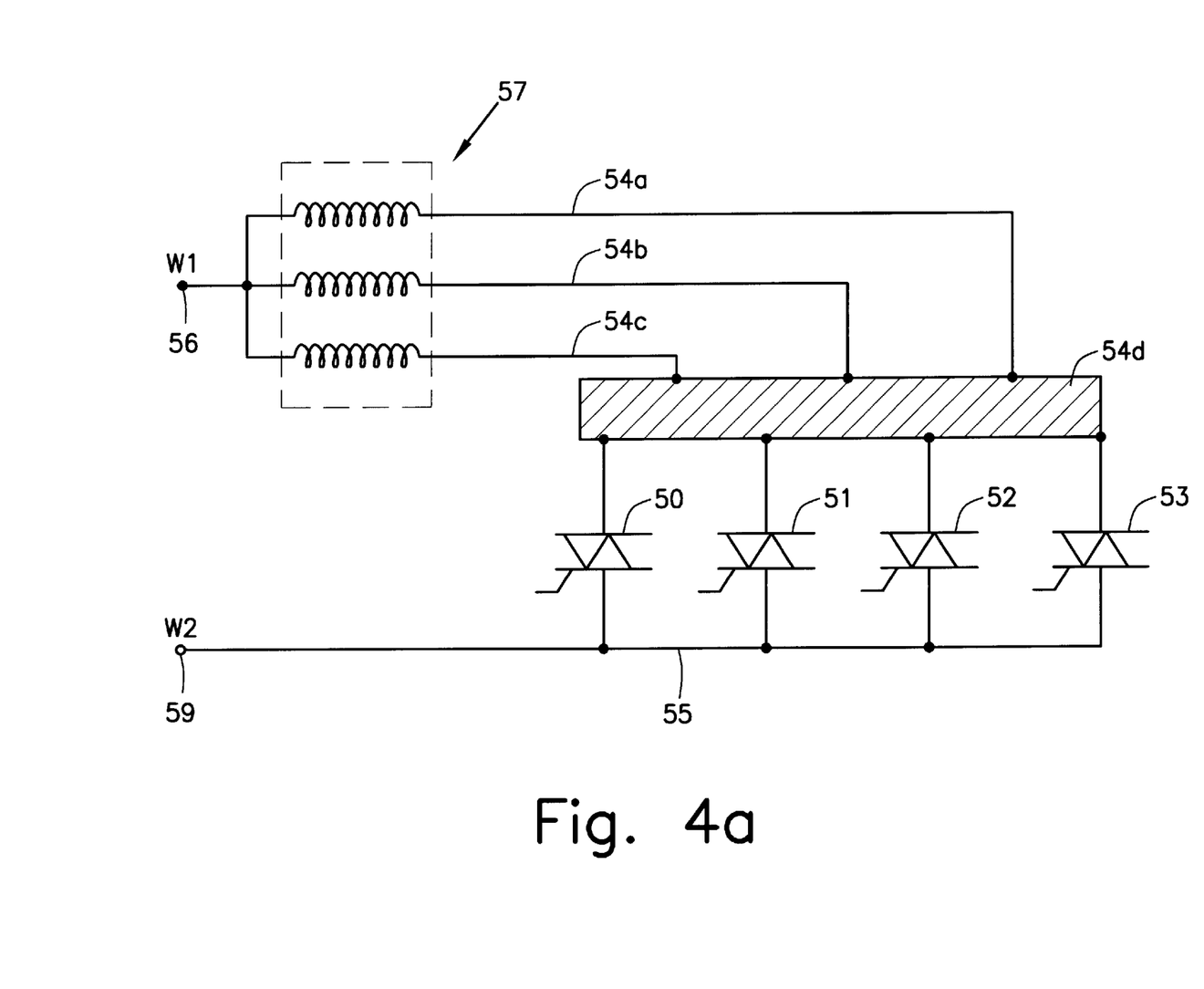
FIG. 4A schematically illustrates the manner in which an identical impedance is obtained in each device control circuit in the circuit of FIG. 4.

FIGS. 4 and 4A are circuit diagrams of a dimmer control which employs four parallel connected spaced semiconductor switching devices in accordance with the invention. Thus, FIGS. 4 and 4A show triacs 50, 51, 52 and 53 which correspond to devices 40 to 43 respectively in FIG. 2b, connected in parallel between conductors 54 and 55. Conductor 54 is connected to a-c terminal 56 through a plural winding inductor 57 (better shown in FIG. 4A as a three winding inductor) and an on-off mechanical switch 58 which is preferably opened at the end of the motion of a manual control slider. Switch 58 could be opened by an actuator separate from the manual control slider. Conductor 55 is connected to a second a-c terminal 59. A lighting load, not shown, is connected in between terminal 59 and circuit neutral.

An RF filter is formed by capacitor 60 and inductor 57. A single control circuit is then provided for the triacs 50 to 53 and includes a variable slide potentiometer 61 and a trimmer potentiometer 62. The slide potentiometer is manually operable as will be later described and operates to supply a variable firing voltage to triacs 50 to 53. The manually operated slide is preferably connected to switch 58 to open the switch when it reaches one end of its motion. An input voltage to the control circuit is provided through resistor 64 and diac 65 which compensates for any line voltage drop. An optional thermal-cut-out 63 can be added to turn the unit off in the event of excessive temperatures. Diac 65 can be replaced by a capacitor or eliminated all together and the dimmer will still operate. The output of potentiometer 61 is connected to diac 66, and charges the single capacitor 67. Four resistors 70, 71, 72 and 73 which are each 10 ohms, ¼ watt are each connected from diac 66 to the gates of triacs 50 to 53 respectively.

To ensure simultaneous firing of the triacs 50 to 53, their input circuits have identical value gate resistors and the impedances through each switching device are matched. The impedance comprises the inductance of inductor 57 and the resistance of copper traces 54a, 54b, 54c on a printed circuit board 190 shown in FIGS. 14 and 15. Matched impedance is produced by having the line 54 of FIG. 4 divided into preferably 3 lines 54a, 54b and 54c (FIG. 4A) which are in series with respective windings of inductor 57. The inductor is shown with three windings, but other winding configurations will also work. The upper power electrodes of triacs 50 to 53 terminate at spaced locations along a bus 54d as shown, also a copper trace. The traces 54a, 54b, and 54c on printed circuit board 190 are sized to ensure the impedance paths through each switching device are matched. Low impedance paths are preferred. Each of lines 54a, 54b and 54c is then connected to bus 54d at a location to ensure a closely identical (matched) impedance through each of the triacs 50 to 53 as measured across terminals 56 and 59.

It will be noted that the triacs 50 to 53 are mounted on a common heat sink as in FIG. 2b. All control components of FIG. 4 are contained on a printed circuit board which is supported above the triacs as will be described later.

As a still further feature of the invention, the use of plural parallel connected devices were found to produce a higher surge capacity, producing a more robust unit less likely to fail when the load is turned on into a short circuit, or during a light bulb failure when the unit is on. More specifically, the fusing current ($I^2T$) for a single 40 ampere rated triac is 450 amps$^2$ seconds. However, the $I^2t$ of 4 parallel connected 25A triacs is 800 amps$^2$ seconds. Thus, the novel device is unexpectedly more robust than the prior art single a-c switch device structure.

FIGS. 5 to 15 show a dimmer 100 of the kind shown in U.S. Pat. No. 4,803,380 modified to include various features of the present invention. The disclosure of U.S. Pat. No. 4,803,380 in other respects can be adopted in carrying out the present invention. Dimmer 100 has a front decorative face plate 101 (FIGS. 5, 7, and 15) which receives an insulation slide receiving adapter plate 103 (FIGS. 7, 8, 10, 11 and 15). Adapter plate 103 has a rim 104 (FIGS. 6, 10, 11 and 15) which is partly telescopically received within rim 102 of face plate 101 with a removable snap connection (not shown).

Figure 5:
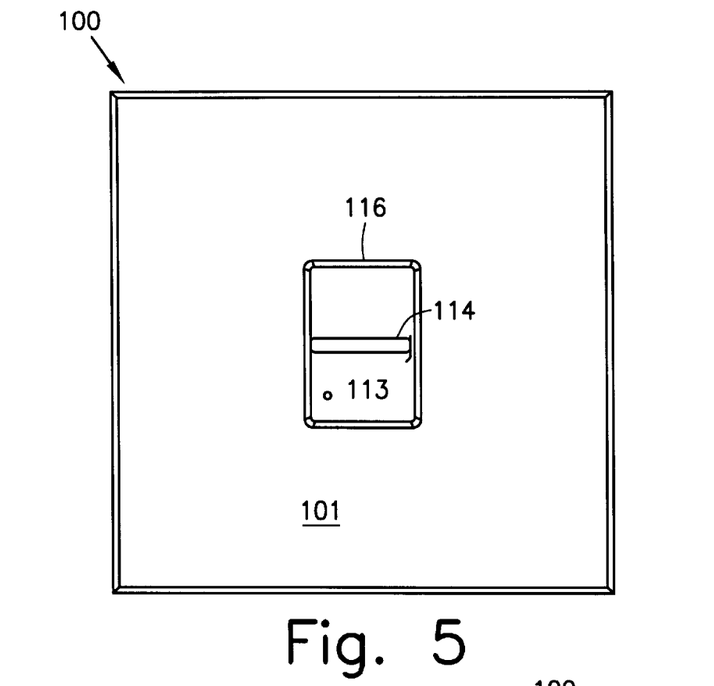
FIG. 5 is a front view of a wall mounted dimmer which can employ the present invention.
Figure 6:
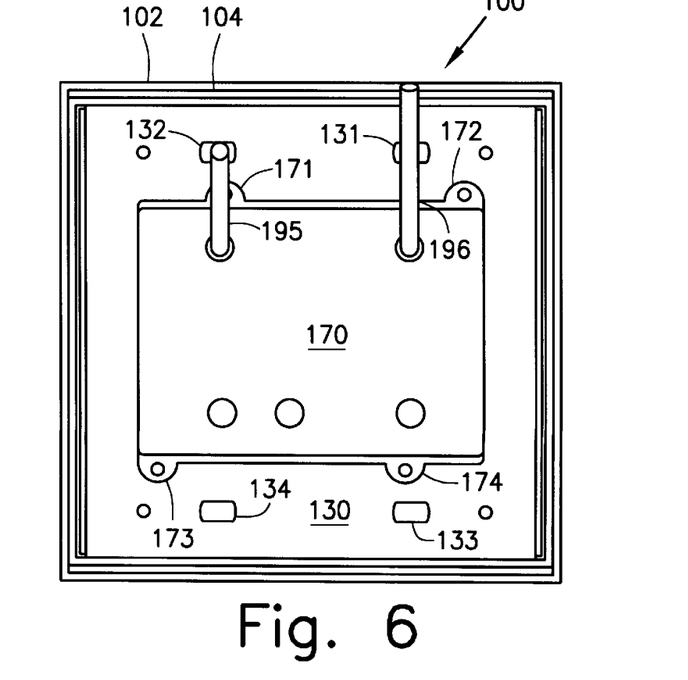
FIG. 6 is a rear view of the dimmer of FIG. 5.

Insulating adapter plate 103 has an opening 110 therein (FIGS. 8 and 10) which has side rails 111 and 112 (FIGS. 10 and 11) which slidably receive a slider 113 (FIG. 6, 8, 10 and 11) which has a projecting operating lever 114 projecting integrally therefrom through opening window 116 of plate 101 of FIG. 5. The rear of slider 113 has an integral cavity 117 (FIG. 10) which receives the end of a potentiometer shaft 118 of a slide potentiometer 119 of FIGS. 9, 14 and 15. (Potentiometer 119 is the same as potentiometer 61 of FIG. 4). It should be noted that the slider 113 (or an alternative rotary control actuator) can also be supported from the heat sink.

Figure 7:
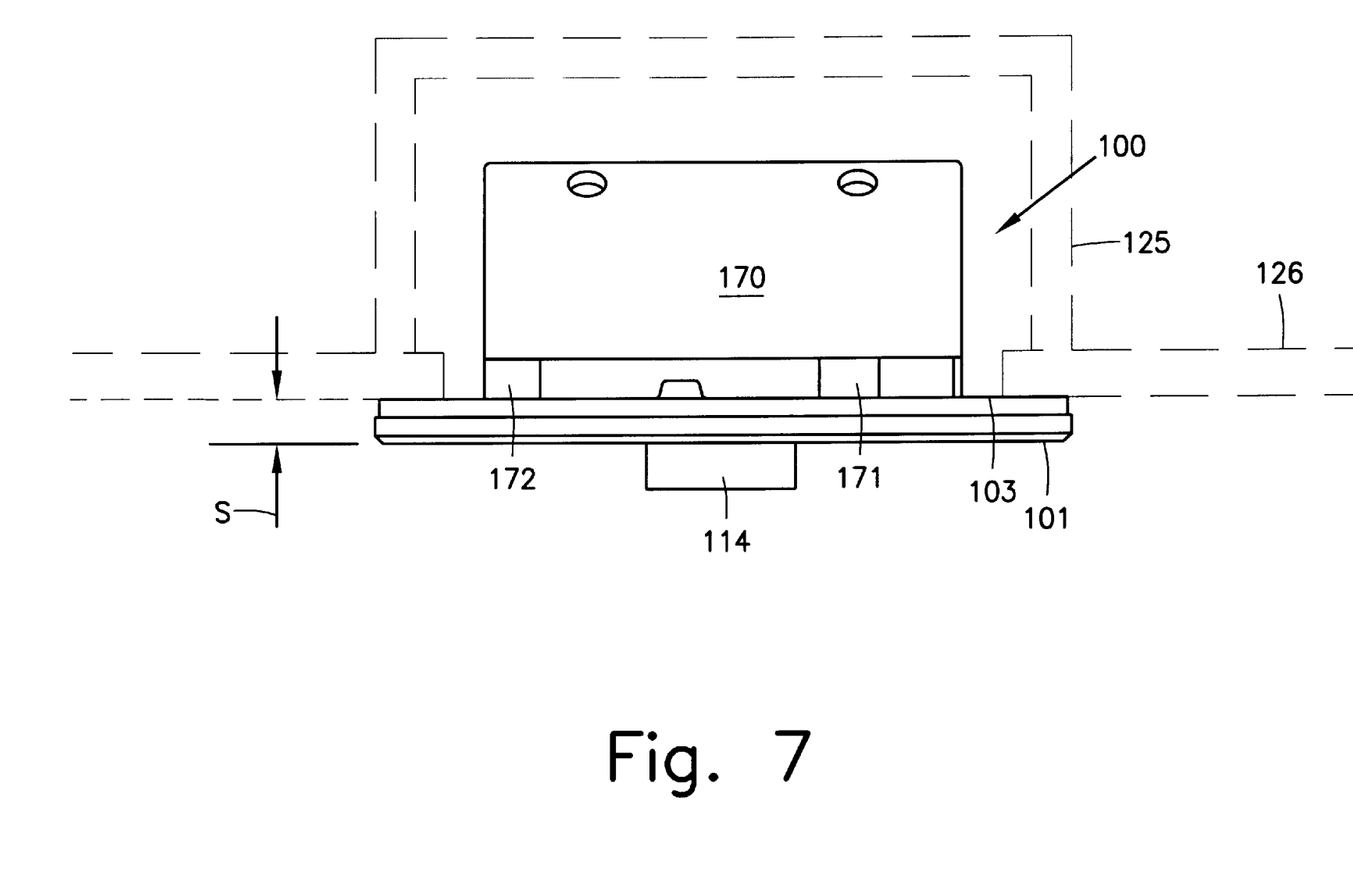
FIG. 7 is a top view of the dimmer of FIG. 5.

The entire dimmer assembly is to be mounted in a wall box shown schematically by dotted lines 125 in FIG. 7 and is mounted flush against the outer surface of a wall schematically shown in dotted lines 126 in FIG. 7. It is desirable that the stand-off distance "S" in FIG. 7 from the surface of face plate 101 to the rear surface of plate 103 be as small as possible for the best aesthetic effect.

Figure 8:
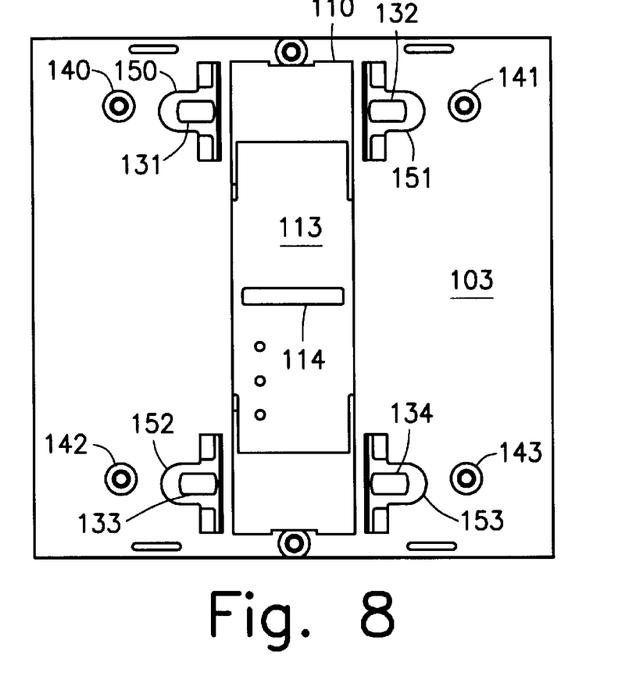
FIG. 8 is a front view of the dimmer of FIG. 5 with the front decorative face plate removed and the insulation adapter plate exposed to view.
Figure 9:
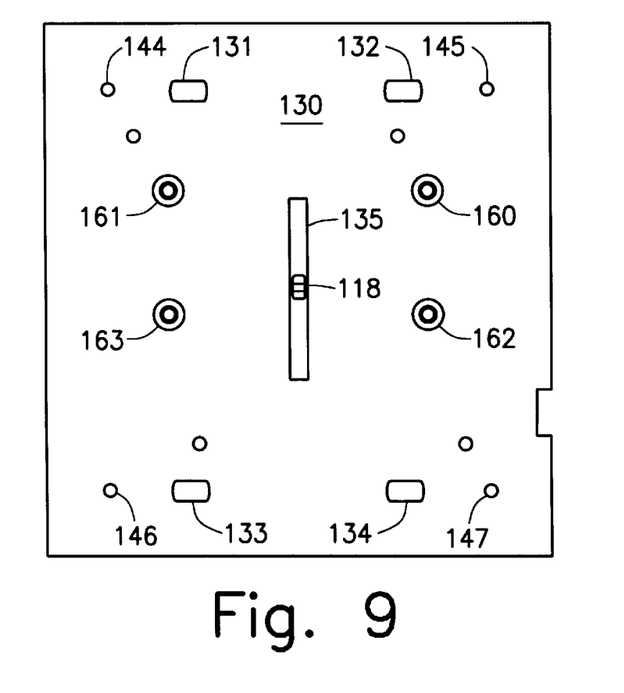
FIG. 9 is a front view of the dimmer of FIG. 5 with the slide carrier insulation adapter plate removed to expose the heat sink.
Figure 12:
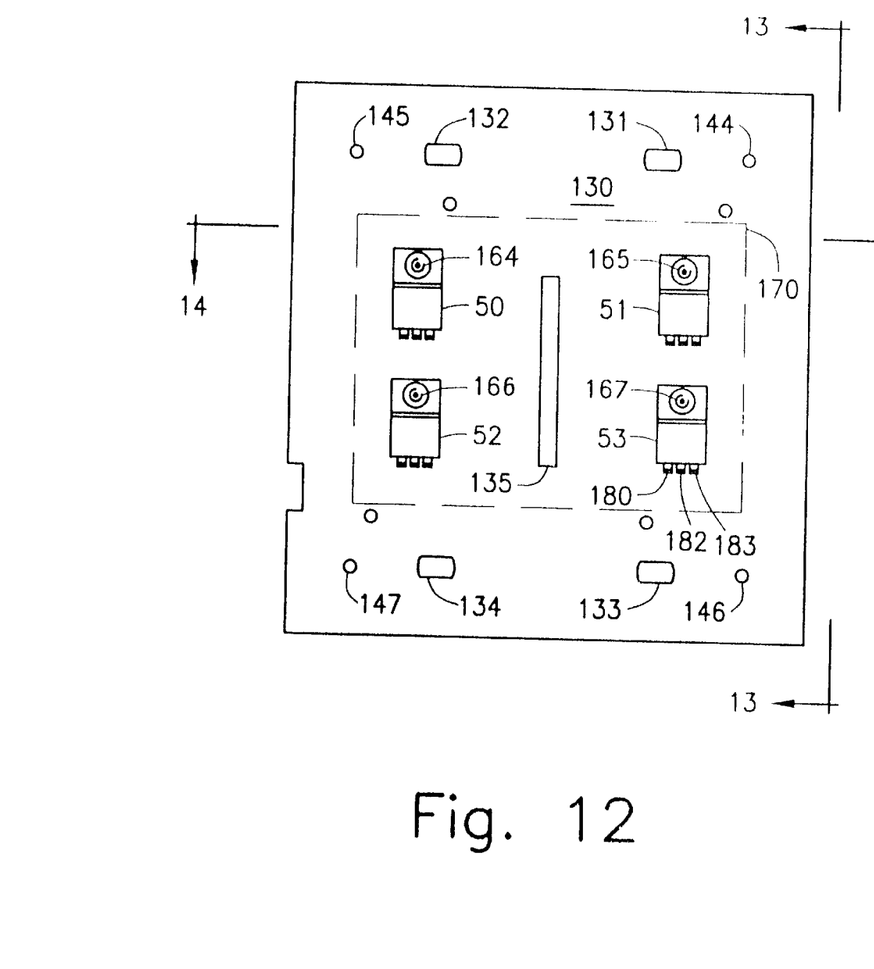
FIG. 12 is a rear view of the heat sink of FIG. 9 and particularly shows 4 parallel connected triacs spaced as far apart as possible, within the footprint of the back cover.
Figure 13:
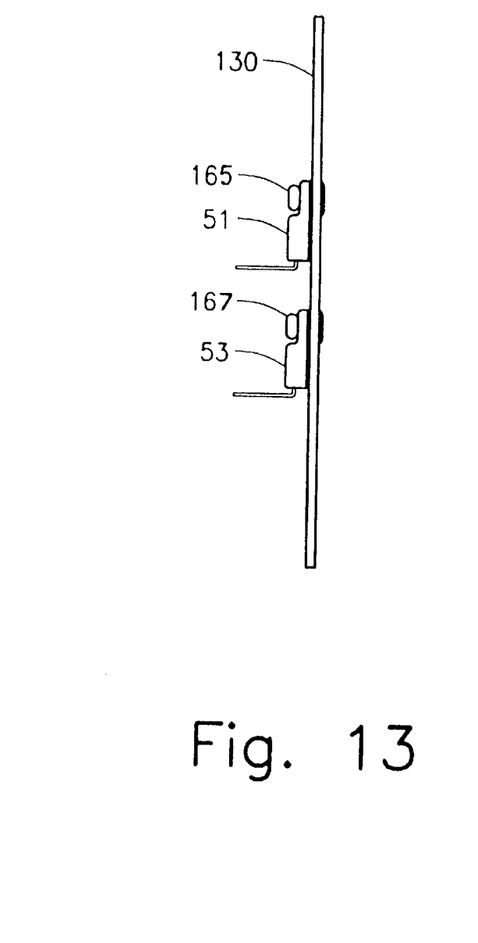
FIG. 13 is an end view of the plate of FIG. 12, as seen from lines 13—13 in FIG. 12.

FIGS. 9, 12, 13, 14 and 15 show a flat copper heat sink 130. Heat sink 130 may have a thickness of about 0.062 inch and will receive plural spaced semiconductor switching devices as will be later described. Heat sink 130 has mounting openings 131 to 134 (FIG. 8, 9 and 12) which enable its conventional attachment to a wall box with plate 101 removed and later snapped on. Heat sink 130 also has an elongated slot 135 (FIGS. 9 and 12) which receives shaft 118 and enables its movement along the length of slot 135. Insulation slide carrier adapter heat sink 103 is secured to the front surface of heat sink plate 130 by screws 140 to 143 (FIG. 8) which are threaded into threaded openings 144 to 147 respectively in heat sink 130 (FIGS. 9 and 12).

Figure 10:
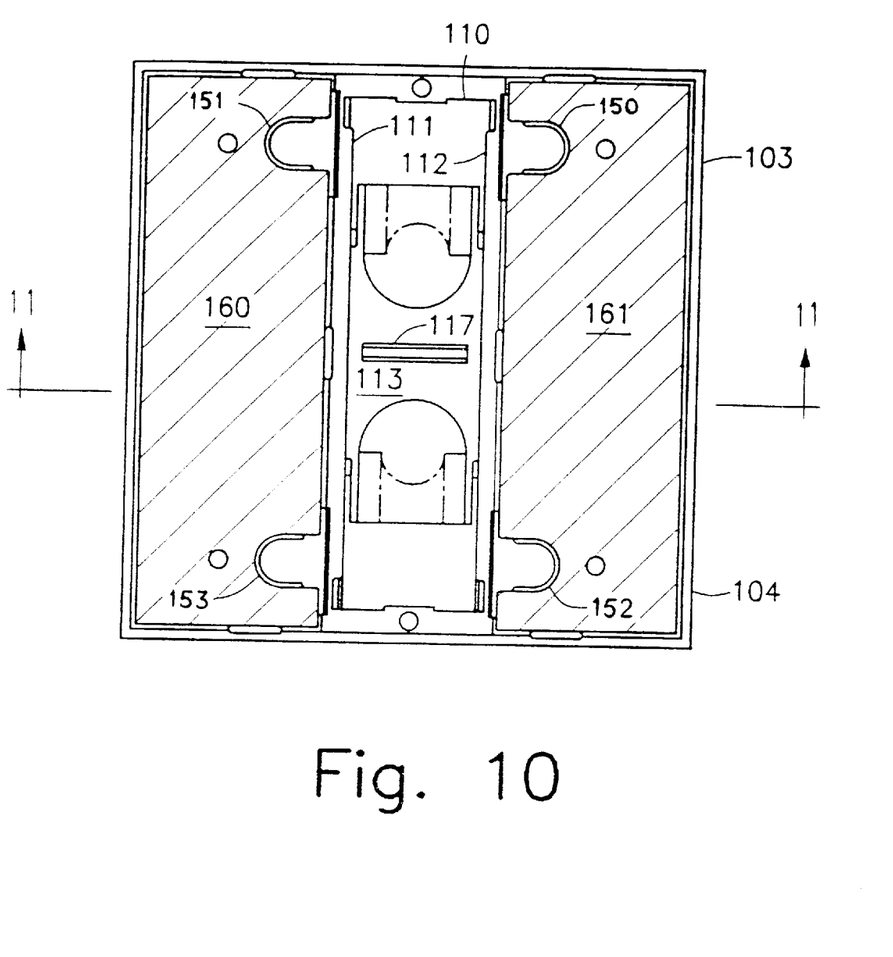
FIG. 10 is a rear view of the slide carrier insulation adapter plate shown in FIG. 8 and shows the use of a thermally conductive layer to thermally connect the heat sink to the slide carrier adapter plate.
Figure 11:
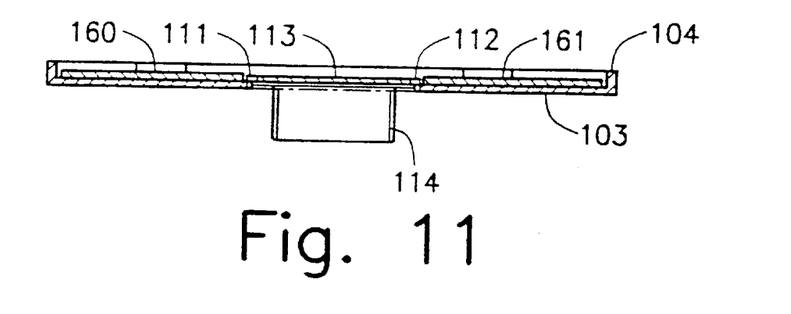
FIG. 11 is a cross-section of FIG. 10 taken across section line 11—11 in FIG. 10.
Figure 15:
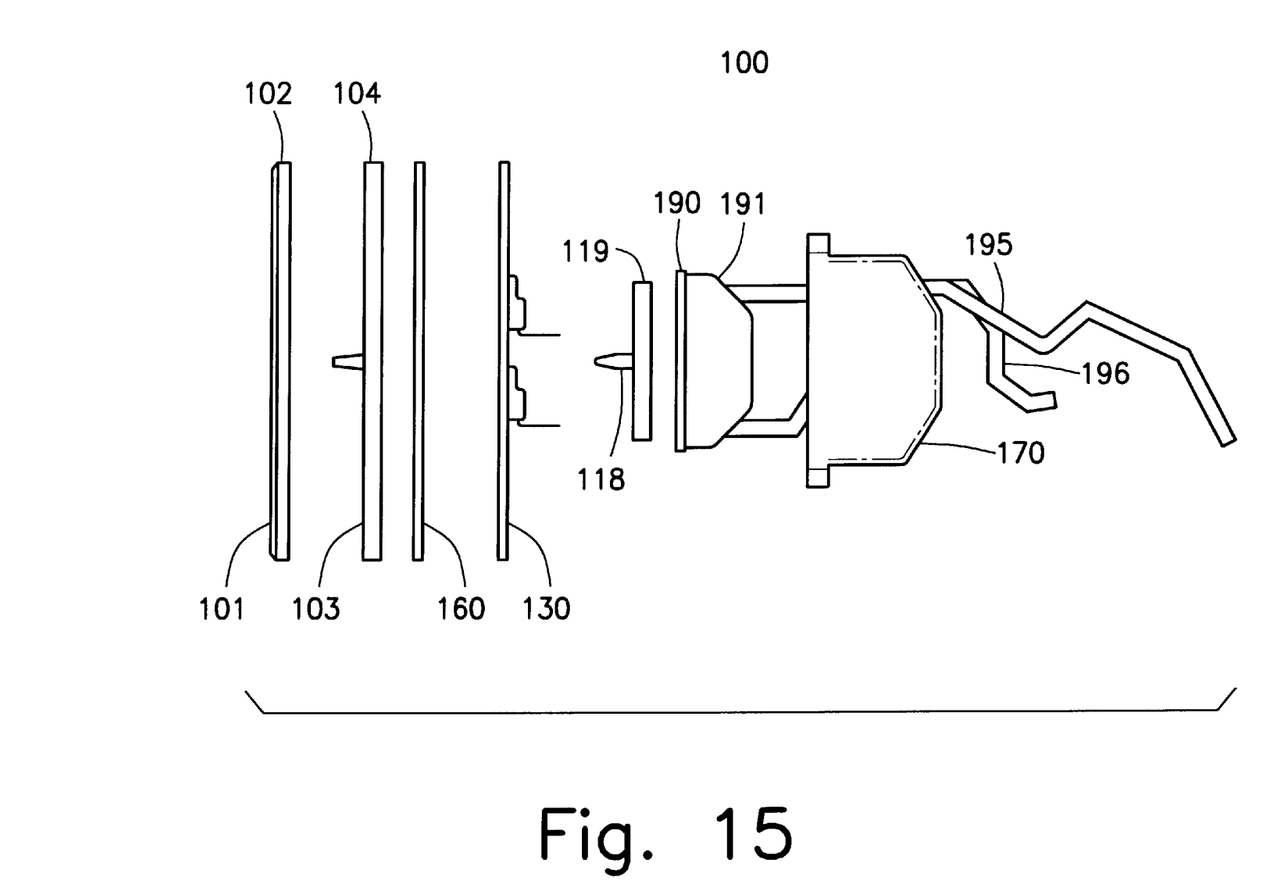
FIG. 15 is an exploded side view of the elements of the wall box dimmer of FIGS. 5 to 14.

As shown in FIG. 8, which is the dimmer of FIG. 5 with face plate 101 removed, it will be seen that openings 150 to 153 are formed in adapter plate 103 to expose mounting openings 131 to 134 respectively. Openings 150 to 153 are also partly shown in FIG. 10. FIGS. 10, 11 and 15 further show novel flexible conductive sheets 160 and 161 which are secured to the inner surface of adaptor 103 as by cementing, and are compressed against the front surface of heat sink 130 when the adapter plate is secured together by screws 140 to 143 (FIG. 8). The compressive sheets 160 and 161 will then permit efficient transfer of heat from heat sink 130 to the front of the dimmer to assist in the cooling of heat sink 130. Sheets 160 and 161 may be a thermally conductive silicon rubber which is about ¹⁄₁₆ inch thick and compressed to about 0.050 inch. The material may be STOCKWELL R-10404-M.

FIGS. 12 to 15 show the placement of triacs 50 to 53 (FIG. 4) on the rear surface of heat sink 130 and in thermal contact therewith. Triacs 50 to 53 are shown as TO-220 style packages fixed to plate 130 by rivets 160 to 163 (FIGS. 9 and 12) through the openings in the tabs of triacs 50 to 53 respectively. A suitable conductive grease may be used to improve the thermal connection between the triacs and the heat sink 130.

Significantly, the triacs 50 to 53 are spaced as widely as possible while staying within the interior corners of insulation back cover 170 (FIGS. 6, 7, 14 and 15) sometimes termed as being within the "footprint" of back cover 170 while still being thermally coupled. Back cover 170 is a double-sized back cover to permit the wider spreading apart of triacs 50 to 53, and has projecting ears 171 to 174 which receive screws connected to threaded openings (not numbered) in heat sink 130.

Figure 14:
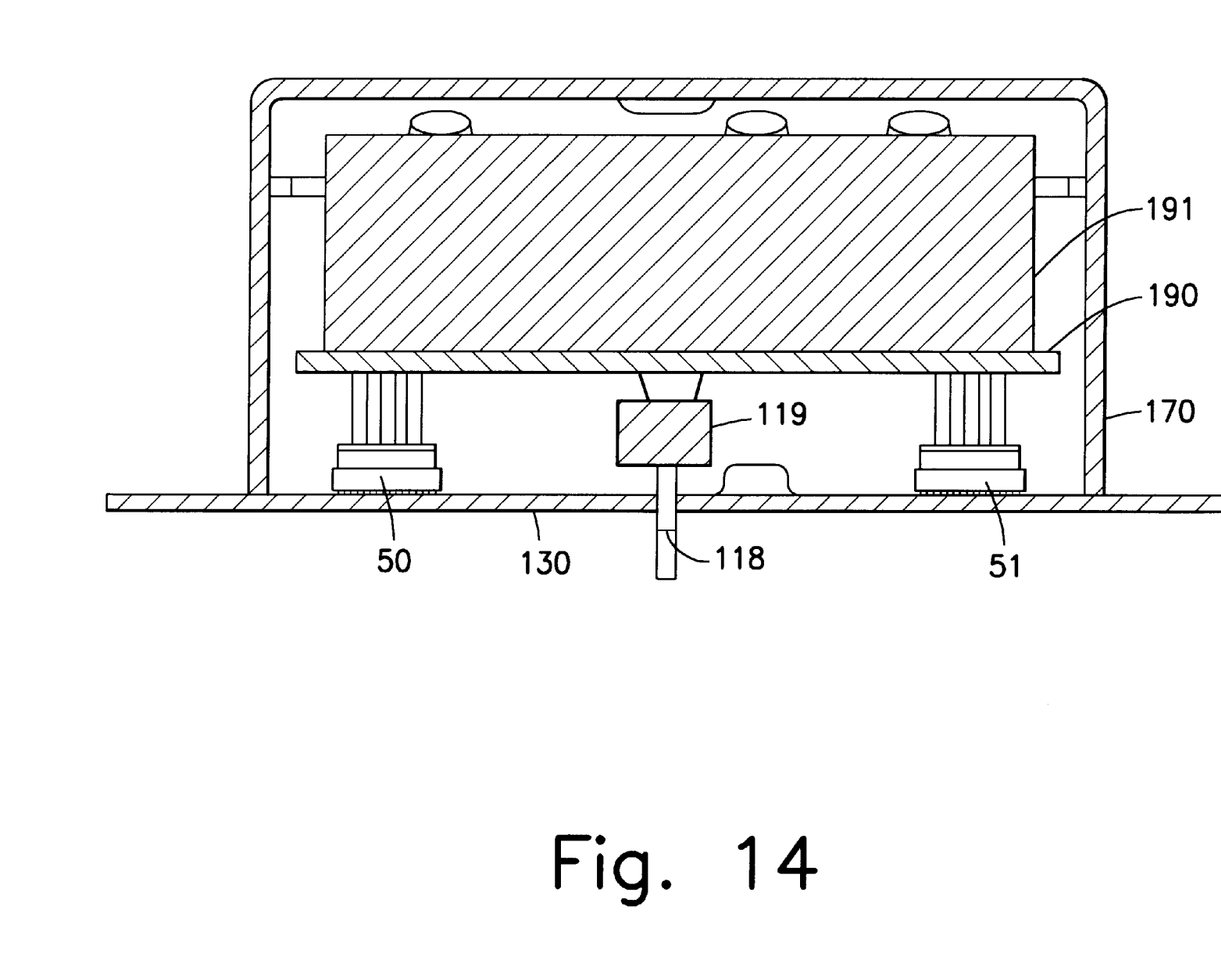
FIG. 14 is a cross-section of the heat sink of FIG. 12, taken across section line 14—14 in FIG. 12, with the control circuit printed circuit board, slide potentiometer and back cover also shown.

The triacs 50 to 53, which may come in any package styles other than the TO-220 as shown, have two main power leads and a control lead (leads 180, 182 and 183 for triac 53 in FIG. 12) which are bent upwardly from heat sink 130 (FIGS. 13 and 14) and are soldered to suitable conductor lines on printed circuit board 190 (FIGS. 14 and 15). The circuit of FIGS. 4 and 4A is shown schematically as block 191 in FIGS. 14 and 15 with the board 190 being physically mounted from the leads of devices 50 to 53. The potentiometer 119 is also fixed to board 190 and heat sink 130 and also acts as a support for board 190 and its control circuit 191.

The power electrodes of triacs 50 to 53 are electrically connected in parallel on board 190, as shown in FIG. 4A, and power leads 195 and 196 (FIGS. 6 and 15), which correspond to the lines in FIG. 4 extending from terminals 56 and 59 respectively, extend through openings in back cover 170. Other power conductor means could be used such as stab connectors and the like. Note that on-off switch 58 is conventionally implemented on circuit 191 in FIGS. 14 and 15.

In practice, the triacs 50 to 53 are centered on the corners of a rectangle shown in dotted lines in FIG. 12 of about 1 inch by 2 inch. This spreading of the triacs and the use of 4 triacs rather than one permitted the increase of the rating of the dimmer from 1500 to 2000 watts while keeping the temperature rise of the back cover below 65° C.

It should be noted that this invention can be applied to any type of control circuit and can use any type of bipolar semiconductor switching device, broken into a plurality of small devices with the same total RMS current currying capacity.

By way of example, the present invention may be advantageously applied to the individual spaced SCRs of U.S. Pat. No. 5,327,047 in which a single pair of back-to-back, or antiparallel connected SCRs replace a single triac. In the U.S. Pat. No. 5,327,047 patent, each individual SCR carries 100% of the load current during alternate one-half cycles. Thus, the total heat generated by the formula:

$$P_{dis}=(V_{TO} \times I_{AVE})+(I^2_{RMS} \times R_{TO})$$

is the same for a single triac and a pair of anti parallel SRCs (having similar characteristics to the triac) because the average current and the RMS current are the same.

Parallel devices have substantially identical instantaneous load currents as a function of time as opposed to anti paralled devices which have load currents that alternate as a function of time. When devices are paralleled, $I_{AVE}$ and $I_{RMS}$ through each device is reduced in proportion to the number of devices in parallel.

The present invention is applicable to each of the individual SCRs of U.S. Pat. No. 5,327,047, wherein each SCR can be replaced by plural identical SCRs thermally spaced from one another and carrying currents of substantially equal instantaneous magnitudes as a function of time. In this manner, the total heat generated is reduced and is better spread over the heat sink to obtain the benefits of the invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A reduced temperature electric power control structure comprising a heat sink having a device mounting surface and at least two parallel connected semiconductor switching devices mounted on said device mounting surface of said heat sink and thermally coupled thereto and which are spaced apart by a distance which substantially thermally couples said at least two semiconductor switching devices carrying instantaneous currents of substantially equal magnitude as a function of time; said at least two semiconductor switching devices producing less power dissipation than a like single semiconductor device which carries the same total current as is carried by said at least two semiconductor devices.

2. The structure of claim 1 wherein said at least two semiconductor switching devices are controllably conductive devices having respective input control electrodes; and further comprising a common control circuit connected to each of said input control electrodes and operable to simultaneously and substantially identically control the current through each of said semiconductor switching devices.

3. The structure of claim 1 wherein said semiconductor switching devices are selected from the group consisting of triacs, thyristors, IGBTs, diodes and SCRs.

4. The structure of claim 1 wherein each of said at least two semiconductor devices have a power dissipation determined by the average current conducted by each device multiplied by its forward turn on voltage drop plus the on resistance of each times the square of the RMS current through each device.

5. The structure of claim 4 wherein said at least two semiconductor switching devices are controllably conductive devices having respective input control electrodes; and further comprising a common control circuit connected to each of said input control electrodes and operable to simultaneously and substantially identically control the current through each of said semiconductor switching devices.

6. The structure of claim 4 wherein said heat sink is a thin copper plate which has a thickness and thermal conductivity to ensure the equal heating of each of said semiconductor devices and the equal division of current between all of said semiconductor devices.

7. The structure of claim 6 wherein said heat sink has a substantially constant thickness.

8. The structure of claim 7 wherein said at least two semiconductor switching devices are controllably conductive devices having respective input control electrodes; and further comprising a common control circuit connected to each of said input control electrodes and operable to simultaneously and substantially identically control the current through each of said semiconductor switching devices.

9. The structure of claim 7 which further includes a back cover which encloses said semiconductor devices and said control circuit; said back cover having a maximum temperature rise less than about 65° C. at maximum current through said semiconductor devices when said power control circuit is connected to and controlling a 2000 watt load.

10. The structure of claim 6 wherein said semiconductor devices are each rated to carry at least 25 amperes and replace a single device which is rated to carry at least 40 amperes.

11. The structure of claim 10 wherein said heat sink has a substantially constant thickness.

12. The structure of claim 6 which further includes a back cover which encloses said semiconductor devices and said control circuit; said back cover having a maximum temperature rise less than about 65° C. at maximum current through said semiconductor devices when said power control circuit is connected to and controlling a 2000 watt load.

13. The structure of claim 12 which comprises 4 semiconductor devices located on the corners of a rectangle surrounding a central area of said copper plate.

14. The structure of claim 13 wherein said 4 semiconductor devices are each rated to carry at least 16 amperes and replace a single device which is rated to carry at least 40 amperes.

15. The structure of claim 4 wherein said heat sink is a flat rectangular thin copper plate, and said semiconductor devices are spaced symmetrically around a central area of said plate.

16. The structure of claim 15 which comprises 4 semiconductor devices located on the corners of a rectangle surrounding a central area of said copper plate.

17. The structure of claim 16 wherein said 4 semiconductor devices are each rated to carry at least 16 amperes and replace a single device which is rated to carry at least 40 amperes.

18. The structure of claim 17 wherein each of said 4 devices is a triac.

19. The structure of claim 17 wherein each of said 4 devices are triacs.

20. A wall mounted control structure for control of a lighting load; said wall mounted control structure comprising a thin rectangular conductive plate which acts as a thermal heat sink and at least two semiconductor switching devices each having respective first and second power electrodes and being supported on and thermally connected to a first surface of said conductive plate and said semiconductor devices being in thermal communication with each other; first and second externally accessible power conductors connected to said first and second power electrodes of said semiconductor switching devices, whereby said at least two devices are connected in parallel; a back cover of insulation material attached to said conductive plate and enclosing said at least two semiconductor switching devices; said first and second externally accessible power conductors extending through said back cover for external connection to a source of power and to said lighting load; an insulation plate connected to a second surface of said conductive plate which is opposite to said first surface; a manually operable operating means for varying the conduction of said semiconductor devices; said at least first and second semiconductor devices being spaced apart by a distance sufficient to more uniformly distribute the heat produced by said devices over a major portion of the area of said conductive plate than if a single semiconductor device were used.

21. The structure of claim 20 wherein said at least two semiconductor switching devices are controllably conductive devices having respective input control electrodes; and further comprising a common control circuit connected to each of said input control electrodes and operable to simultaneously and substantially identically control the current through each of said semiconductor switching devices.

22. The structure of claim 20 wherein said semiconductor switching devices are selected from the group consisting of triacs, thyristors, IGBTs, SCRs and diodes.

23. The structure of claim 20 wherein said thin rectangular conductive plate is a thin copper plate which has a thickness and thermal conductivity to ensure the equal heating of each of said semiconductor devices and the equal division of current between all of said semiconductor devices.

24. The structure of claim 20 wherein said back cover has a maximum temperature rise of 65° C. when said power control circuit is connected to and controls a 2000 watt load.

25. The structure of claim 20 wherein said at least two semiconductor switching devices produce less power dissipation than a single semiconductor device which carries the same total current as is carried by said at least two semiconductor devices, and wherein each of said at least two semiconductor devices have a power dissipation determined by the average current conducted by each device multiplied by its forward turn on voltage drop plus the on resistance of each times the square of the RMS current through each device.

26. The structure of claim 25 wherein said at least two semiconductor switching devices are controllably conductive devices having respective input control electrodes; and a common control circuit connected to each of said input control electrodes and operable to simultaneously and substantially identically control the current through each of said semiconductor switching devices.

27. The structure of claim 25 wherein said back cover has a maximum temperature rise of 65° C. when said power control circuit is connected to and controls a 2000 watt load.

28. The structure of claim 25 wherein said thin rectangular conductive plate is a thin copper plate, and said semiconductor devices are spaced generally symmetrically around a central area of said plate.

29. The structure of claim 28 which comprises 4 semiconductor devices located on the corners of a rectangle generally surrounding the central area of said copper plate.

30. A process for reducing the temperature rise of the insulated back cover of a dimmer device comprising; (a) mounting a plurality of parallel connected semiconductor devices which control a load current to a 2000 Watt lighting load on a thin metallic plate so that the devices carry substantially equal instantaneous current as a function of time and (b) spacing said devices from one another over the surface of said plate by a distance which substantially thermally couples said plurality of parallel connected devices whereby the insulated back cover enclosing the semiconductor devices is heated to a temperature rise less than about 65° C.

31. A process for selecting a current rating for each of a plurality n of parallel connected semiconductor devices and physically arranging the location of each of said devices on the surface of a common heat sink, which is partially covered by a back cover to reduce maximum temperature comprising;
   a) selecting a current rating which is at least 1/n of the total parallel current through said n parallel connected semiconductor devices while reducing the total power dissipation of said devices as compared to the power dissipation of a single device which has a current rating equal to that of the n devices in parallel, and
   b) mounting said selected devices on said surface of said heat sink within the confines of said back cover, such that the selected devices are in thermal communication with each other.

32. An electric power control device comprising a plurality of semiconductor switching devices thermally connected to a common heat sink, wherein a thermal gradient surrounds each semiconductor switching device when the semiconductor switching device is operating, each thermal gradient overlapping at least one other thermal gradient to balance the current carried by each semiconductor switching device.

33. A wall mounted control structure for control of a lighting load; said wall mounted structure comprising a rectangular conductive plate of uniform thickness having first and second opposite surfaces and at least one controllably conductive semiconductor switching device mechanically connected to said plate at its said first surface and in thermal communication therewith; an insulation back cover fixed to said conductive plate and enclosing said at least one controllably conductive switching device; an insulation plate having a first and second surface, the first surface positioned adjacent said second surface of said conductive plate a control circuit for controlling the conduction of said at least one controllably conductive switching device mounted within said back cover; a control device coupled to said control circuit for controlling the operation of said at least one controllably conductive semiconductor switching device; and a thermally conductive layer of material coupled to said insulation plate at said first surface which is in communication with said second surface of said conductive plate; whereby heat from said conductive plate which is produced by said at least one controllably conductive switching device can be conducted to said second surface of said insulation plate.

34. The structure of claim 33 wherein said thermally conductive layer is a thin, flat, compressible fabric.

35. The structure of claim 33 wherein said at least one controllably conductive semiconductor switching device comprises at least two parallel connected semiconductor switching devices mounted on the same surface of said conductive plate and are thermally coupled thereto and which are spaced apart by a distance which substantially thermally couples said devices and reduces the thermal gradient across said plate; said at least two semiconductor switching devices producing less power dissipation than a single semiconductor device which carries the same total current as is carried by said at least two semiconductor devices.

36. The device of claim 35 wherein each of said at least two parallel connected semiconductor switching devices have a power dissipation determined by the average current conducted by each device multiplied by its forward turn on voltage drop plus the on resistance of each times the square of the RMS current through each device.

37. The structure of claim 36 wherein said at least two parallel connected semiconductor switching devices are controllably conductive devices having respective input control electrodes; and further comprising a common control circuit connected to each of said input control electrodes and operable to simultaneously and substantially identically control the current through each of said semiconductor switching devices.

38. The structure of claim 37 wherein said conductive plate is a thin copper plate which has a thickness and thermal conductivity to ensure the equal heating of each of said semiconductor devices and the equal division of current between all of said semiconductor devices.

* * * * *